United States Patent [19]

Otani

[11] Patent Number: 5,619,329
[45] Date of Patent: Apr. 8, 1997

[54] CONTACTLESS THICKNESS MEASURING APPARATUS AND MEASURING METHOD FOR THE SAME

[75] Inventor: Atsushi Otani, Nisshin, Japan

[73] Assignee: Nippondenso Co., Ltd., Kariya, Japan

[21] Appl. No.: 440,137

[22] Filed: May 12, 1995

[30] Foreign Application Priority Data

May 13, 1994 [JP] Japan .................... 6-124636

[51] Int. Cl.$^6$ .................... G01B 11/06; G01B 9/02
[52] U.S. Cl. ............................ 356/382; 356/357
[58] Field of Search .................... 356/381, 382, 356/355, 357; 156/626

[56] References Cited

U.S. PATENT DOCUMENTS

| | | | |
|---|---|---|---|
| 3,869,211 | 3/1975 | Watanabe et al. | 356/381 |
| 3,892,490 | 7/1975 | Uetsuki et al. | 356/382 |
| 4,293,224 | 1/1981 | Gaston et al. | 356/357 |
| 4,312,732 | 1/1982 | Degenkolb et al. | |
| 4,618,262 | 10/1986 | Maydan et al. | 356/355 |
| 5,101,111 | 3/1992 | Kondo | 356/382 |

FOREIGN PATENT DOCUMENTS 2307003  12/1990  Japan .

OTHER PUBLICATIONS

Micro electro mechanical systems, Oison, Japan, Jan. 25–28, 1994, IEEE Catalog No. 94CH3404–1 Kazuyuki Minami et al, pp. 217–222.

Primary Examiner—Hoa Q. Pham
Attorney, Agent, or Firm—Cushman, Darby & Cushman IP Group of Pillsbury Madison & Sutro LLP

[57] ABSTRACT

A contactless thickness measuring apparatus for measuring the thickness of an object includes a light source emitting a variable-frequency light beam, an oscillating center wavelength of which is changeable; an optical device for illuminating the object with the light beam to measure the thickness of the object; a light intensity detecting device for detecting the intensity of light deflected from the object and of light penetrating through the object; a signal processing device for changing the oscillating center wavelength while monitoring the light intensity and containing an amount of phase change from a waveform of a change in light intensity; and an analyzing device for determining an absolute thickness of the object from a relationship between absolute thickness and a phase change amount. In this way, it is possible to measure the absolute thickness of the object without contact using an apparatus having a simple structure by monitoring the object's thickness during its manufacturing process. Furthermore, the apparatus is relatively insensitive to external influences.

18 Claims, 7 Drawing Sheets

CONTACTLESS THICKNESS MEASURING APPARATUS AND MEASURING METHOD FOR THE SAME

CROSS REFERENCE TO RELATED APPLICATION

The present invention is based on and claims priority from Japanese Patent Application No. 6-124636 filed on May 13, 1994, the subject matter of which is incorporated herein by reference.

BACKGROUND OF THE INVENTION

1. Field of the Invention

The present invention relates to a measuring apparatus and a measuring method for measuring the thickness of products such as films, layers, semiconductors, etc. The present invention especially relates to a contactless thickness measuring apparatus and a method for measuring an object's thickness without contacting the object by using interference light.

2. Description of the Related Art

In recent years, semiconductor devices manufactured using very high scales of integration have been developed. In producing such devices, it is important to maintain a high level of accuracy because such semiconductor devices have an extremely small structure. For instance, when a silicon diaphragm is formed by etching, the thickness of the diaphragm is controlled by managing the silicon etching time. However, the thickness varies depending on the etching condition. For such reasons, there is a great need for highly accurate control of the silicon thickness by monitoring the silicon thickness during the etching process.

Japanese Patent Laid-Open Publication No. Hei 2-307003 discloses a method of monitoring semiconductor etching by observing variations in the strength of interfering light which is reflected from a semiconductor layer illuminated by laser light. Another prior art method proposes measuring the thickness of a silicon layer based on light from a silicon layer which has been illuminated by a halogen light. (See, e.g., NEWS/94 Proceedings pp. 217–222).

In the first above-described method of semiconductor layer thickness measurement, it is possible to measure variations in the layer thickness; however, it is impossible to measure the absolute thickness and the layer's original thickness must be known in advance to monitor the thickness variations. In the second above-described method, the detected light is too weak, and is likely to be influenced by extraneous influences such as the roughness of the silicon surface. The apparatus is also large-sized because a specific highly stable detecting device is necessary.

"Absolute thickness" as used above and hereinafter means the thickness of an object as defined by a predetermined measurement system, e.g., twenty nanometers, etc., as opposed to relative thickness, the amount or percentage of change in the object's thickness relative to some other point on the object.

SUMMARY OF THE INVENTION

The present invention is made in view of the above problems, and an object of the present invention is to provide a measuring apparatus and a measuring method capable of measuring the absolute thickness of semiconductor layer without contacting the layer. It is another object of the present invention to provide such an apparatus which is simple in structure and resistant to external influences.

According to a first aspect of the present invention, an apparatus for non-contact measurement of an object's absolute thickness includes a light source selectively illuminating the object with a source light beam at least at a first frequency and a second frequency different from the first frequency, a light intensity detector measuring an intensity of a reflected light beam reflected by the object and generating a detection signal representative of the intensity, and a thickness determining device for determining an absolute thickness of the object based on the detection signal. In that way, it is possible to measure the absolute thickness of the object without contact using an apparatus having a simple structure by monitoring the object's thickness during its manufacturing process.

According to a second aspect of the present invention, a method of measuring an object's absolute thickness includes an illuminating step for selectively illuminating the object with a source light beam at least at a first frequency and a second frequency different from the first frequency, a measuring step for measuring an intensity of a reflected light beam reflected by the object and generating a detection signal representative of the intensity, and a determining step for determining an absolute thickness of the object based on the detection signal. Thereby, similar advantages to those described above can be obtained.

BRIEF DESCRIPTION OF THE DRAWINGS

Other objects, features and characteristics of the present invention as well as the functions of related parts will become more clear from a study of the following detailed description, the appended claims, and the drawings. In the accompanying drawings:

DETAILED DESCRIPTION OF THE PREFERRED EMBODIMENTS

A first embodiment of the present invention is described below.

Figure 1:
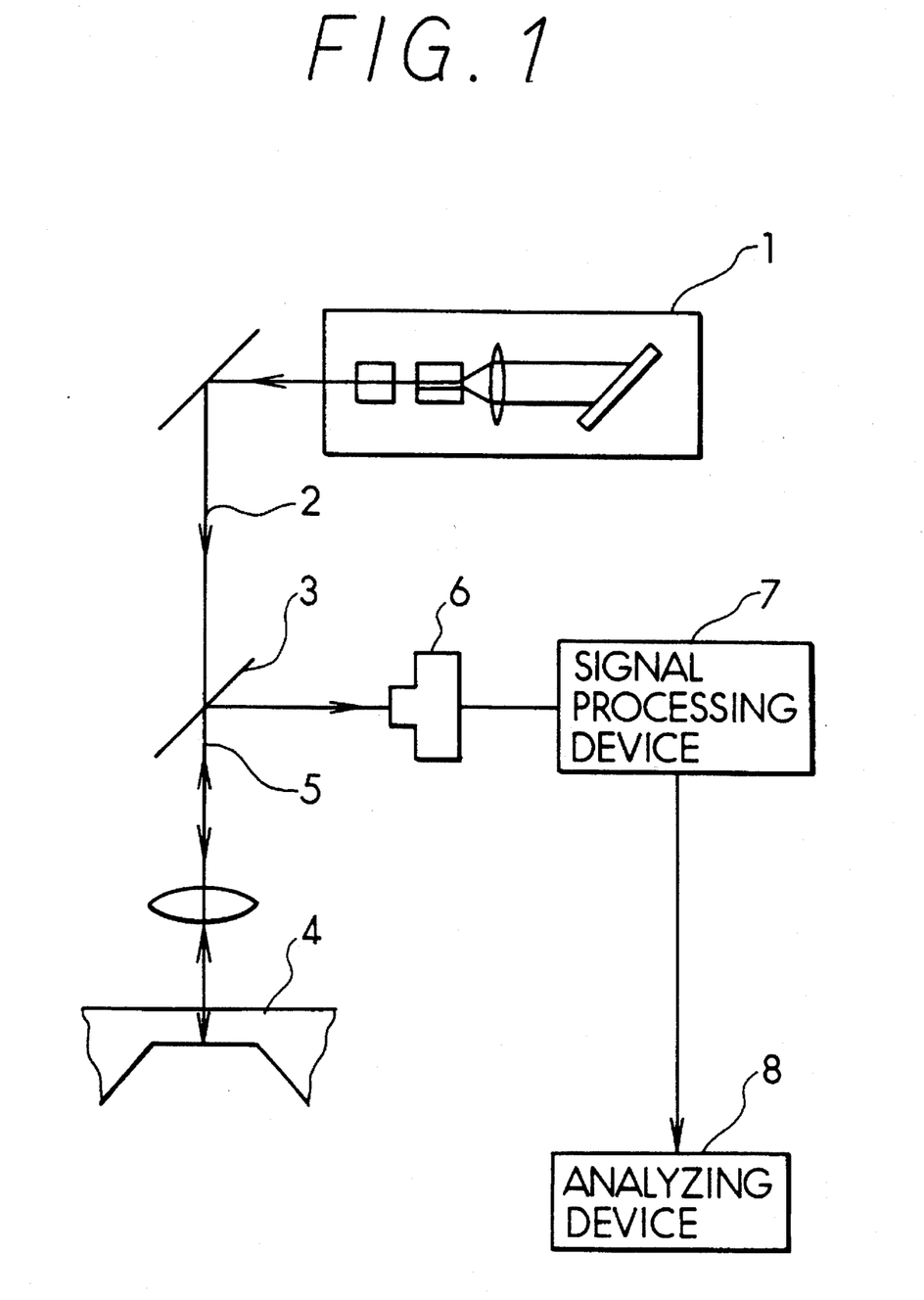
FIG. 1 shows a system according to a first embodiment of the present invention.

A contactless measuring apparatus for measuring a thickness of a portion of a silicon layer according to the first embodiment is schematically shown in FIG. 1. In that Figure, a light source 1 emits a source light beam 2, an oscillating center wavelength of which can be changed in a near-infrared wavelength region in which silicon is substantially transparent. Source light beam 2 illuminates a silicon sample 4 made of silicon to measure the thickness of the sample 4 using an optical element or beam splitter 3 which divides the light source beam 2 into two beams, one in a reflecting direction and one in a passing direction. Lights which are reflected by the front surface of a silicon sample 4 and by a back surface of the silicon sample 4 interfere with one another and thereby an interference light is generated. An interference light beam 5 which is reflected by sample 4 is directed to a detecting device 6 by optical element or beam splitter 3, and detecting device 6 outputs an electrical signal based on the intensity of the beam illuminating the detecting device 6. The signal output by the detecting device 6 is inputted to a signal processing device 7. An output signal from the signal processing device 7 is inputted to an analyzing device 8. Finally, analyzing device 8 computes the absolute thickness of the silicon sample 4. Although not specifically shown in FIG. 1, analyzing device 8 controls light source 1 and signal processing device 7 simultaneously.

Figure 2:
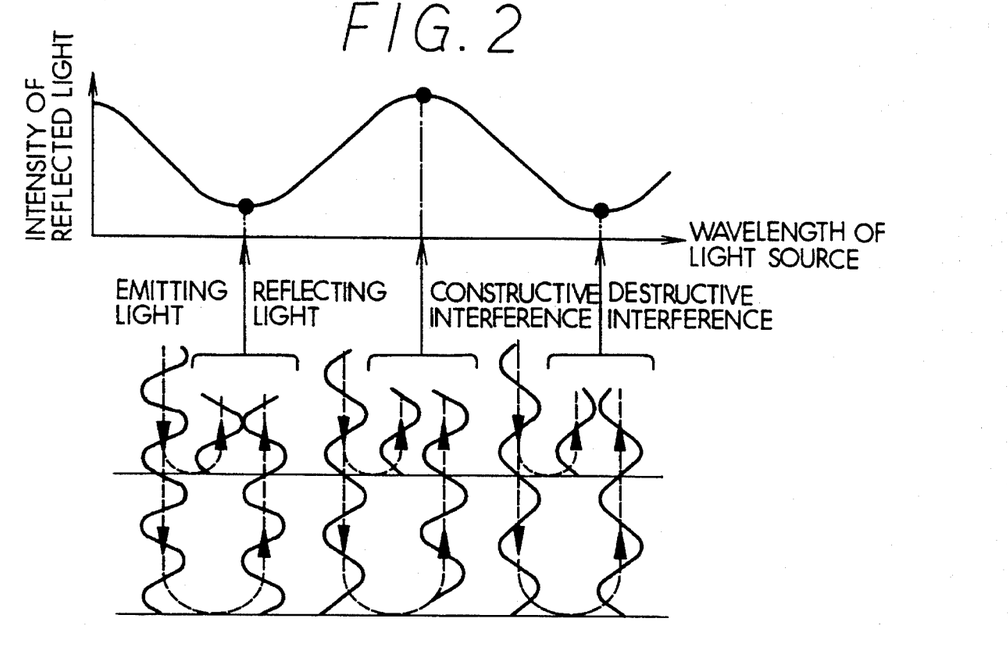
FIG. 2 is an explanatory view of a detecting principle of the present invention.
Figure 3:
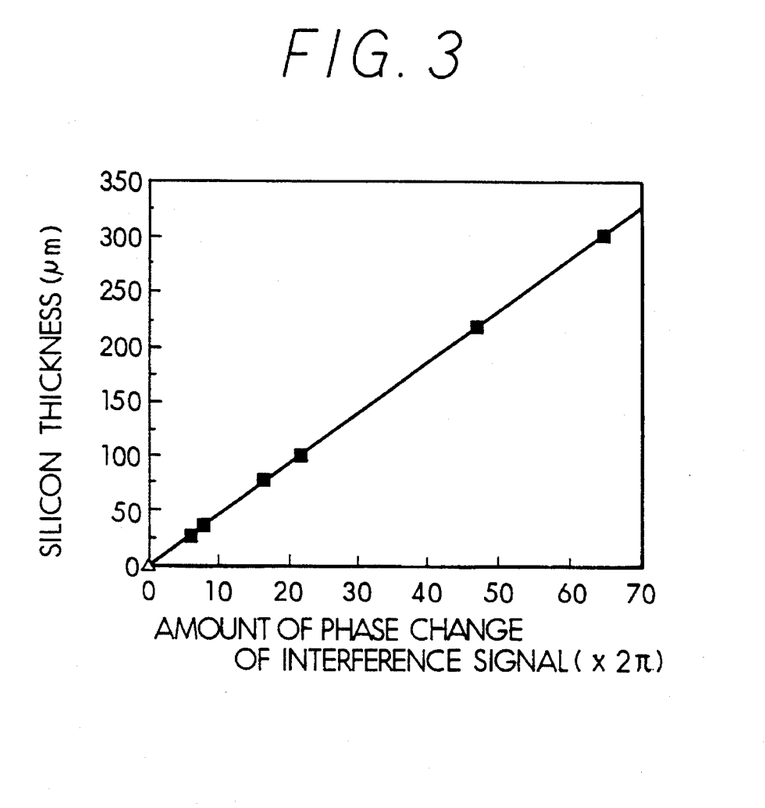
FIG. 3 shows a relationship between an amount of phase change in an interference signal and the thickness of a silicon layer.

In FIG. 1, light beam 2 is arranged to illuminate a predetermined point on one surface of semiconductor silicon sample 4. If the path of emitting light beam 2 and interference light beam 5 is not blocked, it is possible to illuminate the object with source light beam 2 while the semiconductor silicon sample 4 is manufactured. Source light beam 2 is reflected by a front surface of silicon sample 4 and also passes through the sample to be reflected by a rear surface of sample 4. Interference light beam 5 is formed through the interference of the reflected light. When the wavelength of light source 1 is changed as shown in FIG. 2, interference light beam 5 exhibits constructive interference effects and restrictive interference effects and the detecting device 6 detects the intensity of the interference light beam 5. Although the rate of change of the wavelength of source beam 2 may be preferably greater than the rate of change of the silicon sample thickness, it was found from the inventor's experiments that, even if the rate of change of the wavelength of source beam 2 is lower than the rate of change of the silicon sample thickness, the silicon sample thickness during the etching can still be amended and measured. When the wavelength of light source 1 is changed from $\lambda 1$ to $\lambda 2$, the phase change of the interference light beam 5 is assumed to be $\phi$ [rad]. The thickness of silicon sample 4 (hereinafter referred to as "silicon thickness") is expressed by the following formula based on the interference relationship.

$$d = \frac{\phi}{4\pi n \left( \frac{1}{\lambda_1} - \frac{1}{\lambda_2} \right)} \quad (1)$$

n denotes an index of refraction of silicon in the vicinity of $\lambda 1$ and $\lambda 2$. Therefore, it is possible to measure the absolute thickness d by detecting a phase change $\phi$ of the interference signals using signal processing device 7 and analyzing device 8. As seen from FIG. 3 showing the results of several experimental tests, it is confirmed that the formula (1) closely corresponds to the actual measurements.

Figure 4A:
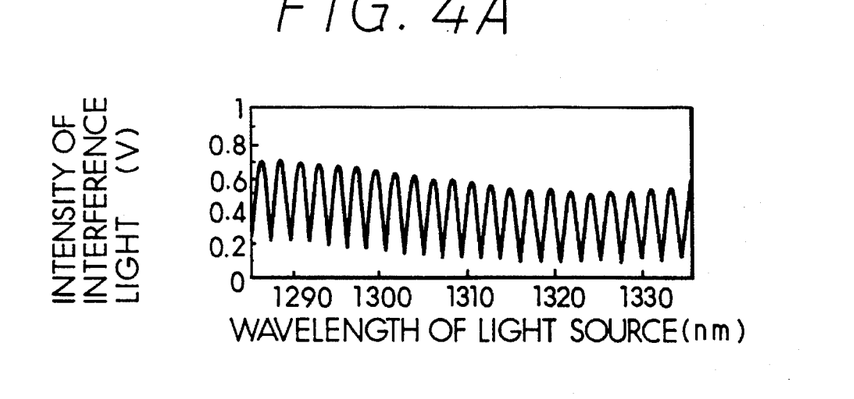
FIGS. 4A–4C are explanatory views showing changes in the intensity of an interference light in accordance with a thickness of silicon by etching.
Figure 4B:
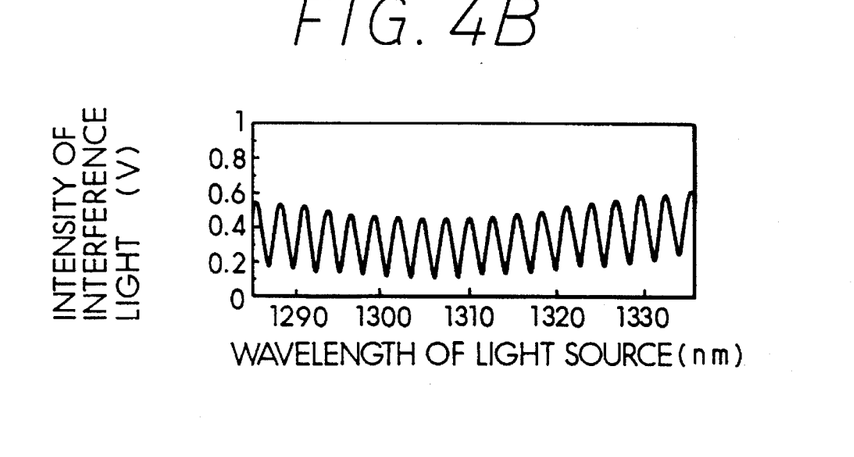
Figure 4C:
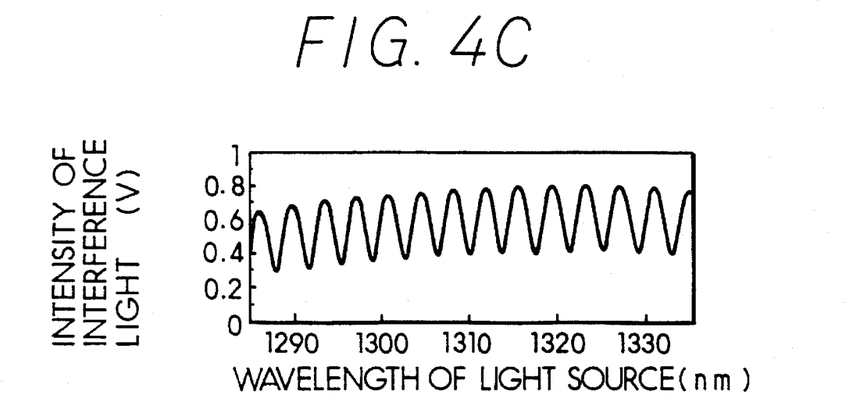

An interference signal in the above-described system is shown in FIG. 4. The interference signal is observed in real time during the manufacture of a silicon sample having a thickness which is reduced by etching, such as when forming a silicon diaphragm. As the etching proceeds and the silicon sample becomes thinner as shown in FIGS. 4A to 4C, the phase change of the interference signal decreases when the wavelength of light source 1 is changed. Many different methods can be used to detect the phase-change of the interference signal; however, in this embodiment, a method of frequency analysis which does not directly calculate the phase change $\phi$ is used. More specifically, when the wavelength of light source 1 is changed by a predetermined amount $\Delta\lambda$, the interference light beam 5 forms a waveform which has a small frequency modulation applied to a central frequency when the wavelength is shown in an axis of abscissas. A relationship of the central frequency f and the silicon thickness d is expressed by the following formula (2), which is obtained by differentiating the formula (1).

$$d = \frac{\lambda_o^2}{2n\Delta\lambda} \cdot f \quad (2)$$

In the formula (2), $\lambda$o denotes a central wavelength of the light from light source 1, and the central frequency f assumes that the $\Delta\lambda$ is a basic frequency (i.e., a frequency when f=1). The data other than the central frequency f have been obtained previously; therefore, it is possible to obtain the absolute thickness d by detecting the central frequency f.

Figure 5:
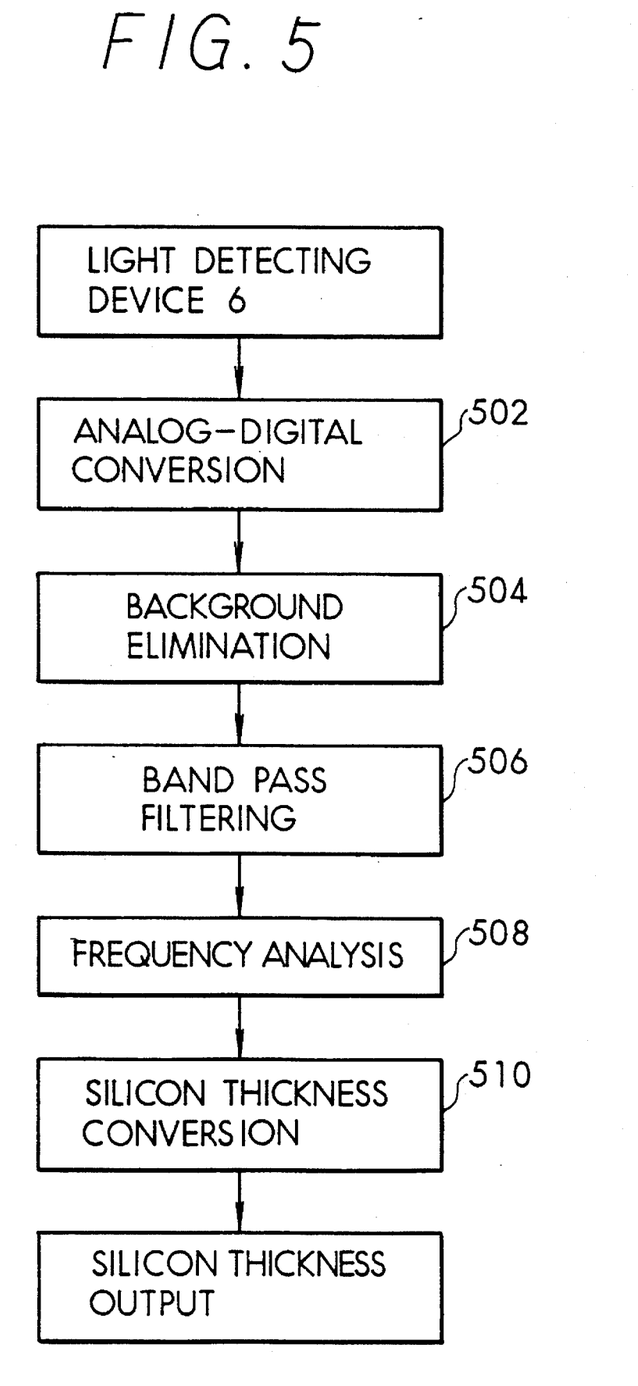
FIG. 5 is a flowchart showing a process in a signal processing portion and an analyzing portion.
Figure 6A:
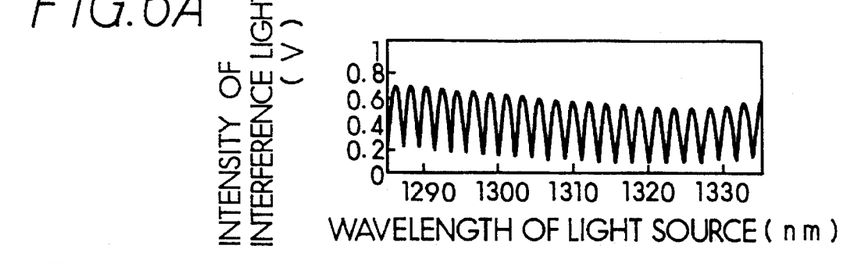
FIGS. 6A–6C shows the relationship between wavelength of light sources and intensity of interference light and FIG. 6D shows a relationship between frequency of interference signal and power in a process in FIG. 5.
Figure 6B:
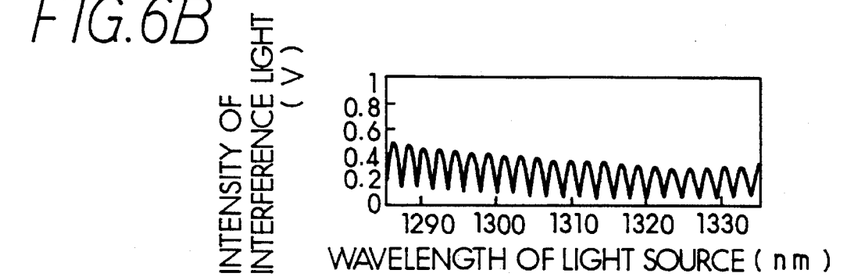
Figure 6C:
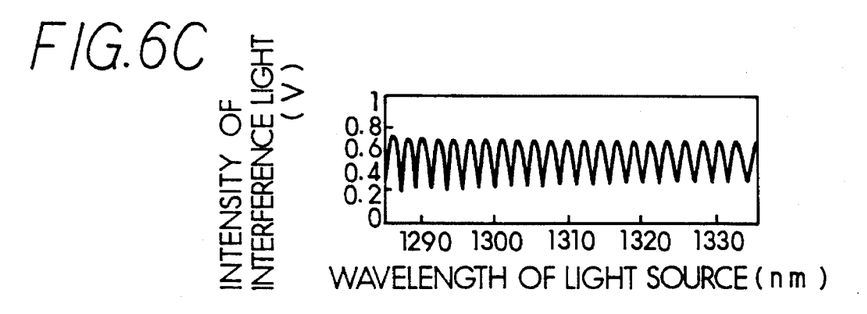

In FIG. 5, the operation of signal processing device 7 and analyzing device 8 is shown. First, an analog signal from detecting device 6 is converted into a digital signal at step 502. A waveform shown in FIG. 6A is obtained therefrom. The interference signal is divided with a value characteristic of the detecting portion responsivity which has been measured in advance to eliminate any adverse influences at step 504. That is to say, error characteristics inherently in the detected portion (wavelength dependency of the detection sensitivity in this embodiment) have been searched in advance, and the error factor which may be included in the detection result is eliminated at the BG elimination step 504 (so-called background elimination). A waveform shown in FIG. 6B is obtained therefrom. An upper threshold value corresponding to a maximum layer thickness and a lower threshold value corresponding to a minimum layer thickness are substituted for d in the formula (2), and respective interference signal frequency thresholds are obtained. Frequency components representative of influences other than the silicon thickness are then eliminated by a bandpass filter which permits only signals having frequencies between the above upper and lower threshold frequencies at step 506 to pass. A waveform shown in FIG. 6C is obtained in that way.

Frequency analysis is then performed to obtain a frequency spectrum of the interference signals at step 508, and a central frequency f, which is a frequency in the interference signal 5 having the greatest power, is obtained.

Figure 6D:
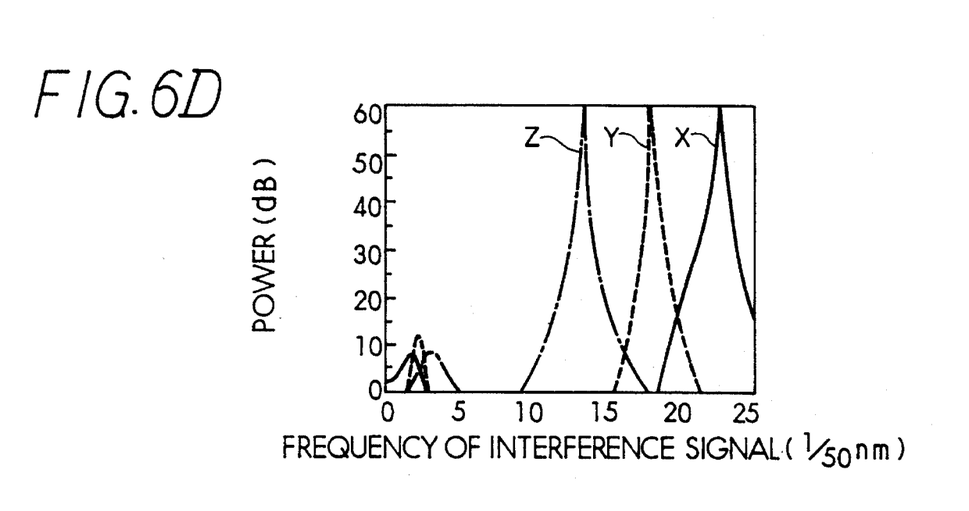

In FIG. 6D, spectra which have been obtained from the interference signals in FIGS. 4A–4C by a linear prediction method are shown by graph lines X–Z, respectively. In that Figure, the peak point of each graph line indicates the central frequency f.

Each of the three graph lines shows the central frequency at a different time during formation of the silicon sample 4. For example, the thinner the silicon thickness becomes by etching, the smaller the central frequency becomes: that is, the line moves from the line X to the line Z shown in FIG. 6D. Finally, the central frequency f is substituted for f in the formula (2), thereby determining the silicon thickness D. The same result can be obtained using signal processing with an FFT (Fast Fourier Transform).

Figure 7:
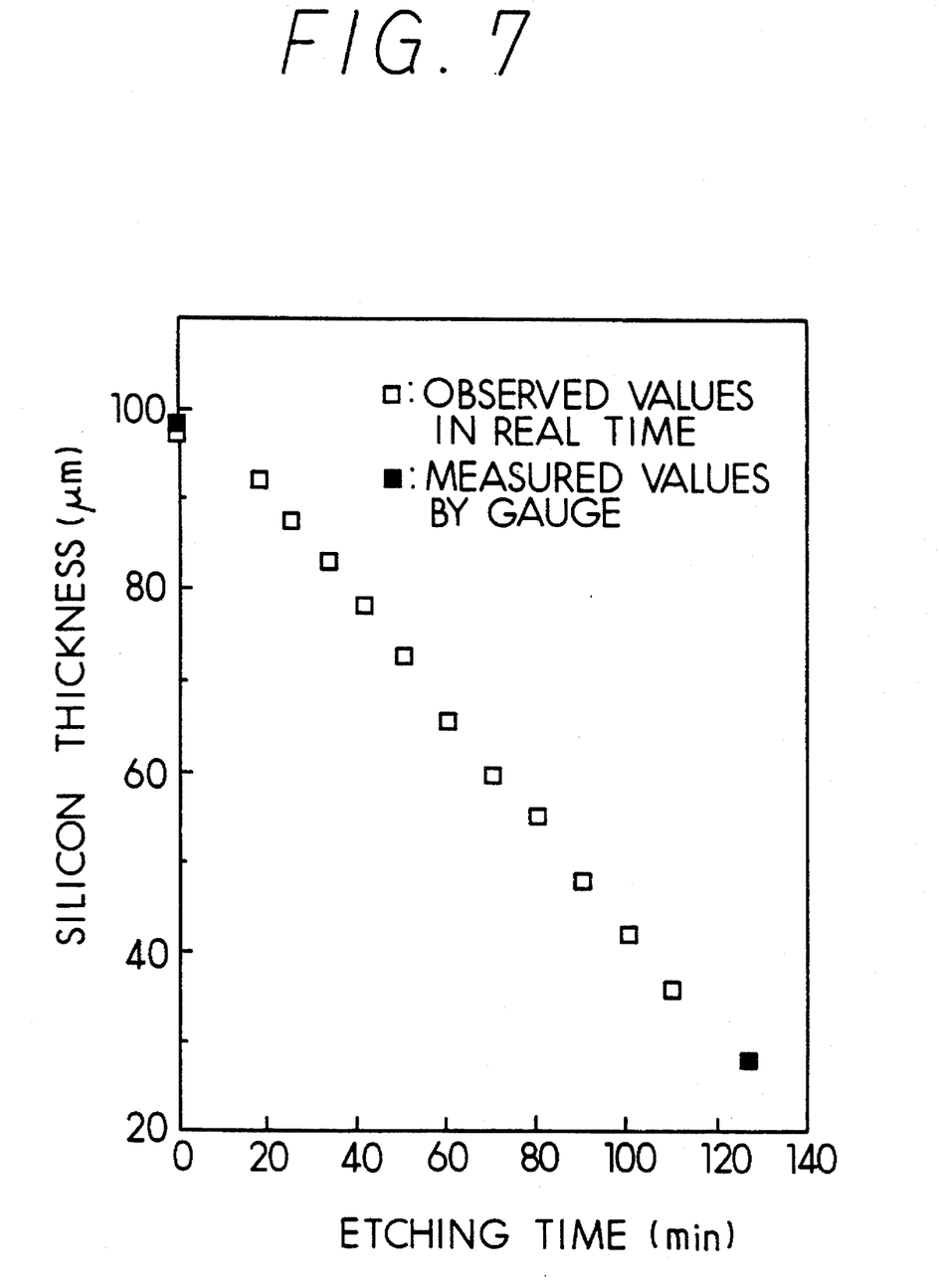
FIG. 7 shows a relationship between an etching time and a thickness of silicon.

As described above, it is possible to determine the thickness of the silicon sample from one side thereof without any contact (by using a reflected light). It is also possible to monitor the absolute thickness of the silicon sample 4 in real time even when the thickness continuously changes during the manufacturing process. Therefore, it is possible to terminate processing of the silicon sample 4 when the thickness reaches the predetermined value, thereby manufacturing the silicon sample 4 with high accuracy. In FIG. 7, a result when the sample thickness is monitored in real time during the etching process is shown. As can be seen in FIG. 7, it is possible to perform elaborate manufacturing control by monitoring the thickness of the semiconductor layer during the manufacturing process.

A second embodiment according to the present invention is described below.

The accuracy of light source 1 must be high to determine the amount of wavelength change or the absolute wavelength with accuracy; thus, the cost of the system is relatively high. Alternatively, it is advantageous to employ a system shown in FIG. 8 in which a reference optical system is provided in addition to the optical system shown in FIG. 1. A reference sample 20 having an identical composition to that of silicon sample 4 is prepared. The thickness of reference sample 20 has been accurately measured in advance. The system includes a detecting device 21 and a signal processing device 22 which have identical functions to those of detecting device 6 and signal processing device 7, respectively. A reference signal from signal processing device 22 is inputted to analyzing device 8. That is to say, when the silicon layer thickness is measured, a light beam from light source 1 simultaneously illuminates reference sample 20 and the variation in light reflected therefrom or penetrating therethrough is detected by detecting device 21. In the same manner as in the first embodiment, signal processing is performed by signal processing device 22 and the processed signal is inputted to analyzing device 8. It is also possible to combine the two signal processing devices 7 and 22 into a single device.

Figure 8:
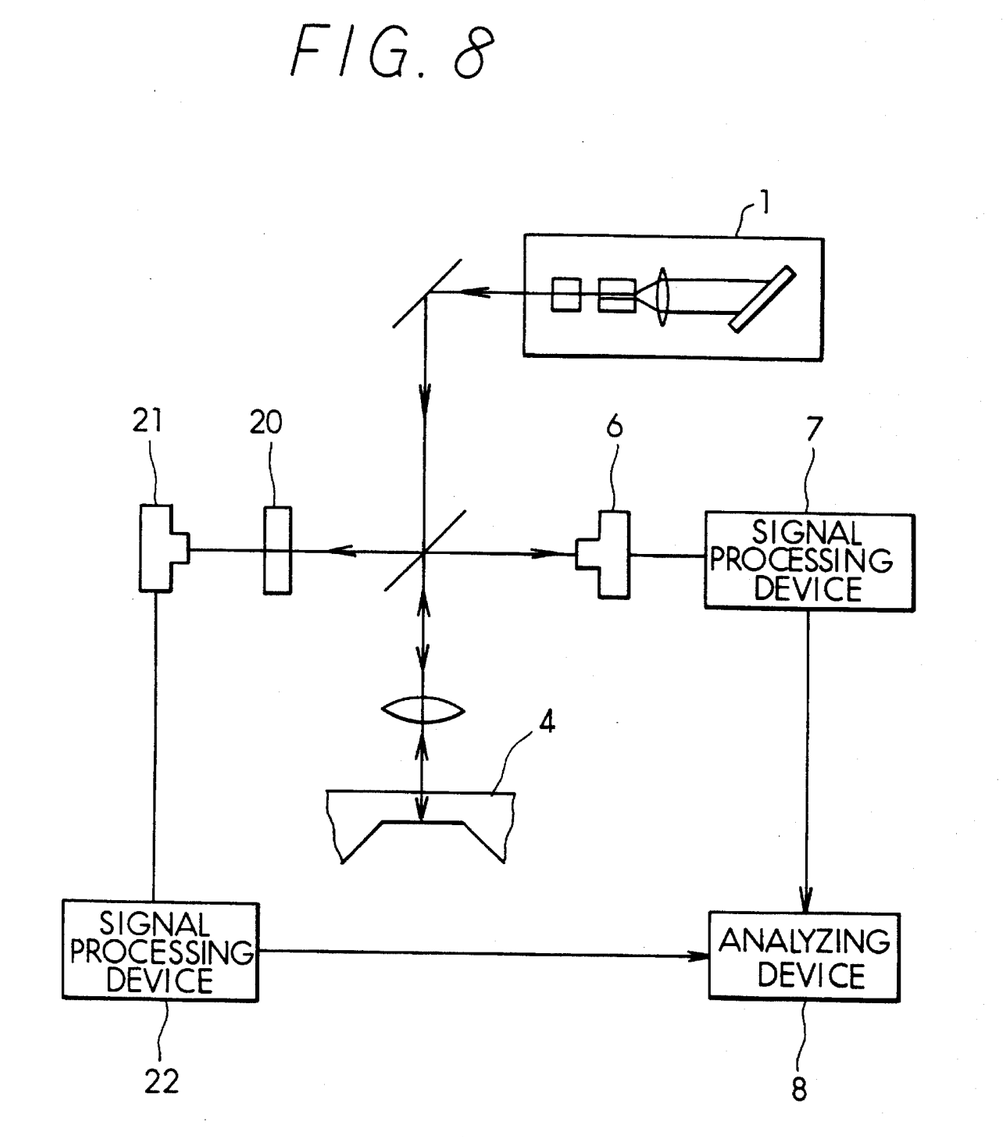
FIG. 8 shows a system according to a second embodiment of the present invention.

A method of analyzing an interference signal using the above apparatus is described below. Assuming the frequency of interference which is outputted from signal processing device 22 is $f_{ref}$ and the frequency which is outputted from signal processing device 7 is $f_{obj}$, the thickness $d_{obj}$ of silicon sample 4 and the thickness of the reference sample 20 are related according to the following formula (3) which has been obtained from formula (2). Therefore, it is possible to determine the absolute thickness $d_{obj}$ of the silicon sample using the formula (3) without having to measure the wavelength of the light source accurately, reducing expense:

$$d_{Obj} = \frac{f_{obj}}{f_{ref}} \cdot d_{ref} \quad (3)$$

The process of detecting a phase change φ from a waveform of an interference signal as described above is not limited to the frequency domain. However, it is also possible to employ a method of detecting a wavelength between points at which the waveform intensity crosses 0, or a method of detecting a wavelength between peak points of the waveform.

If the optical system shown in FIG. 1 includes an optical fiber or a light guide, it is possible to make the system more compact and easier to handle, and it is advantageous to use the system to make measurements at points during the manufacture of the silicon sample. The number of measuring points is not limited to a single point. Rather, it is possible to measure several points simultaneously if the source light beam is divided into several beams and the corresponding number of detecting devices are provided.

The present invention has been described in connection with what are presently considered to be the most practical and preferred embodiments. However, the invention is not meant to be limited to the disclosed embodiments, but rather is intended to include all modifications and alternative arrangements included within the spirit and scope of the appended claims.

What is claimed is:

1. An apparatus for non-contact measurement of an absolute thickness of a sample object, said apparatus comprising:
    a light source for selectively illuminating said sample object with a source light beam, said light source emitting said source light beam in such a manner that a wavelength of said source light beam varies continuously within a predetermined wavelength range;
    a light intensity detector measuring an intensity of a reflected light beam reflected-by said sample object and generating a detection signal representative of said intensity, said detection signal varying in said intensity in response to said continuous variation in said wavelength of said source light beam; and
    thickness determining means for determining an absolute thickness of said sample object based on an amount of phase change which appears in said variation of said detection signal according to said continuous variation within said predetermined wavelength range.

2. The apparatus of claim 1, wherein said light source emits said source light beam such that said wavelength of said source light beam continuously varies from a first wavelength $\lambda_1$ to a second wavelength $\lambda_2$, said first wavelength and said second wavelength being within said predetermined wavelength range, and wherein said thickness determining means determines said absolute thickness of said sample object based on a relationship as follows:

$$d = \frac{\phi}{4\pi n \left( \frac{1}{\lambda_1} - \frac{1}{\lambda_2} \right)}$$

wherein d represents said absolute thickness of said sample objects φ represents said amount of phase change appearing in said continuous variation of said wavelength of said source light beam from said first wavelength to said second wavelength, and n represents an index of refraction determined the composition of said sample object.

3. The apparatus of claim 2, wherein said predetermined wavelength range lies within a frequency range in which said sample object is substantially transparent to light.

4. The apparatus of claim 2, wherein said first and second wavelengths lie within a frequency range in which said sample object is substantially transparent to light.

5. The apparatus of claim 4, wherein said first and second wavelengths are in an infrared light region.

6. The apparatus of claim 1, wherein said object is made of silicon.

7. The apparatus of claim 1, further comprising an optical assembly directing said emitted light to said object.

8. The apparatus of claim 7, said optical assembly comprising a beam splitter.

9. The apparatus of claim 1, wherein said reflected light beam includes light reflected from a first side of said object and light passing through said object and reflected by a second side of said object, said light from said first and second sides interfering with each other.

10. The apparatus of claim 1, further comprising:
    a reference object whose absolute thickness is known;
    a beam splitter diverting a portion of said source light beam to illuminate said reference object;
    a reference intensity detector measuring an intensity of a reference beam reflected by said reference object and generating a reference detection signal representative of said reference beam intensity;

reference thickness confirming means for confirming said absolute thickness of said reference object based on said reference detection signal; and compensation means for determining an actual absolute thickness of said sample object responsive to said thickness determining means and said reference thickness confirming means.

11. A method of measuring an absolute thickness of a sample object comprising:

an illuminating step for selectively illuminating said sample object with a source light beam in such a manner that a wavelength of said source light beam varies continuously within a predetermined wavelength range;

a measuring step for measuring an intensity of a reflected light beam reflected by said sample object and generating detection signal representative of said intensity, said detection signal varying said intensity in response to said continuous variation in said wavelength of said source light beam; and a determining step for determining an absolute thickness of said sample object based on an amount of phase change which appears in said variation of said detection signal according to said continuous variation within said predetermined wavelength range.

12. The method of claim 11, wherein said determining step includes:

signal processing step for determining a difference of a phase of said detection signal when said sample object is illuminated by said source light beam, said wavelength of said source light beam continuously varying from a first wavelength $\lambda_1$ to a second wavelength $\lambda_2$; and analyzing step for determining said absolute thickness of said sample object based on a relationship as follows:

$$d = \frac{\phi}{4\pi n \left( \frac{1}{\lambda_1} - \frac{1}{\lambda_2} \right)}$$

wherein d represents said absolute thickness of said sample object, $\phi$ represents said amount of phase change appearing in said continuous variation of said wavelength of said source light beam from said first wavelength to said second wavelength, and n represents an index of refraction determined by the composition of said sample object.

13. An apparatus for non-contact measurement of an absolute thickness, of a sample object said apparatus comprising a light source illuminating said sample object with a variable-frequency illuminating light beam, an oscillating center wavelength of said illuminating light beam being changeable;

a light intensity detector for measuring an intensity of a reflected light beam reflected by said sample object and generating a detection signal representative of said intensity, said reflected light beam including light reflected from a first side of said sample object and light passing through said object and reflected by a second side of said sample object, said light from said first and second sides interfering with each other;

a signal processing means for changing said oscillating center wavelength while detecting said detection signal and for obtaining an amount of phase change from a waveform of a change in light intensity; and thickness determining means for determining an absolute thickness of sample object from the following relationship:

$$d = \frac{\lambda_0^2}{2n\Delta\lambda} \cdot f$$

wherein d represents said absolute thickness of said sample object, $\Delta\lambda$ represents an amount of change in wavelength of said illuminating light beam, $\Delta\alpha$ represents said oscillating center wavelength of said illuminating light beam, f represents a central frequency of said reflected light beam, and n represents an index of refraction determined by the composition of said sample object.

14. The apparatus of claim 13, further comprising an optical assembly directing emitted light from said sample light source to said object.

15. The apparatus of claim 14, further comprising:

a reference object whose absolute thickness is known;

a beam splitter diverting a portion of said source light beam to illuminate said reference object, a reference intensity detector measuring an intensity of a reference beam reflected by said reference object and generating a reference signal representative of said reference beam intensity;

reference thickness confirming means for confirming said absolute thickness of said reference object based on said reference detection signal; and compensation means for determining an actual absolute thickness of said sample object responsive to said thickness determining means and said reference thickness confirming means.

16. The apparatus of claim 13, wherein said sample object is made of silicon.

17. An apparatus for non-contact measurement of an absolute thickness of a sample object, said apparatus comprising:

a reference object whose absolute thickness is known;

a light source for selectively illuminating said sample object with a source light beam, said light source emitting said source light beam in such a manner that a wavelength of said source light beam continuously varies within a predetermined wavelength range;

a beam splitter diverting a portion of said source light beam to illuminate said reference object;

a light intensity detector measuring an intensity of a reflected light beam reflected by said sample object and generating a detection signal representative of said intensity, said detection signal varying in said intensity in response to said continuous variation in said wavelength of said source light beam;

a reference intensity detector measuring an intensity of a reference beam reflected by said reference object and generating a reference detection signal representative of said reference beam intensity, said reference detection signal varying in said intensity in response to said continuous variation in said wavelength of said source light beam;

thickness determining means for determining an absolute thickness of said sample object based on an amount of phase change which appears in said variation of said detection signal according to said continuous variation within said predetermined wavelength range;

reference thickness confirming means for confirming said absolute thickness of said reference object based on said reference detection signal; and compensation means for determining an actual absolute thickness of said of said sample object responsive to said thickness determining means and said reference thickness confirming means.

18. An apparatus for non-contact measurement of an absolute thickness of a sample object, said apparatus comprising:

a reference object whose absolute thickness $d_{ref}$ is known;

a light source for illuminating said sample object and said reference object with a source light beam, said light source emitting said source light beam in such a manner that a wavelength of said source light beam varies continuously within a predetermined wavelength range, wherein said source light beam is converted by said sample object into a first interference light beam whose intensity varies at a first frequency $f_{obj}$ in accordance with a wavelength scanning operation of said source light beam, and said source light beam is converted by said reference object into a second interference light beam whose intensity varies at a second frequency $f_{ref}$ in accordance with said wavelength scanning operation of said source light beam;

a first light intensity detector measuring said intensity of said first interference light beam from said sample object and generating a first detection signal representative of said intensity of said first interference light beam;

a second light intensity detector measuring said intensity of said second interference light beam from said reference object and generating a second detection signal representative of said intensity of said second interference light beam; and thickness determining means for determining an absolute thickness of said sample object $d_{obj}$ by calculating said first and second frequencies from said first and second detection signals, respectively, and from the following relationship:

$$d_{obj} = \frac{f_{obj}}{f_{ref}} \cdot d_{ref}.$$

* * * * *